(12) United States Patent
Lee

(10) Patent No.: US 8,597,530 B2
(45) Date of Patent: Dec. 3, 2013

(54) METHOD OF FORMING SEMICONDUCTOR DEVICE

(75) Inventor: Min Sub Lee, Geumcheon-gu (KR)

(73) Assignee: SK hynix Inc., Icheon-Si (KR)

( * ) Notice: Subject to any disclaimer, the term of this patent is extended or adjusted under 35 U.S.C. 154(b) by 310 days.

(21) Appl. No.: 12/938,102

(22) Filed: Nov. 2, 2010

(65) Prior Publication Data
US 2011/0104898 A1 May 5, 2011

(30) Foreign Application Priority Data
Nov. 5, 2009 (KR) .................. 10-2009-0106462

(51) Int. Cl.
| | | |
|---|---|---|
| B44C 1/22 | (2006.01) | |
| C03C 15/00 | (2006.01) | |
| C03C 25/68 | (2006.01) | |
| C23F 1/00 | (2006.01) | |
| C23F 3/00 | (2006.01) | |
| H01L 21/302 | (2006.01) | |
| H01L 21/461 | (2006.01) | |
| H01L 21/311 | (2006.01) | |

(52) U.S. Cl.
USPC .................. 216/62; 216/42; 216/58; 216/74; 216/79; 438/689; 438/706

(58) Field of Classification Search
None
See application file for complete search history.

(56) References Cited

U.S. PATENT DOCUMENTS

| | | | | |
|---|---|---|---|---|
| 7,291,560 B2 * | 11/2007 | Parascandola et al. | ........ | 438/689 |
| 2006/0046484 A1 * | 3/2006 | Abatchev et al. | ............. | 438/689 |
| 2008/0045026 A1 * | 2/2008 | Kikutani | ....................... | 438/706 |

FOREIGN PATENT DOCUMENTS

| | | | |
|---|---|---|---|
| EP | 0706202 A2 * | 4/1996 | |
| JP | 2002-064059 A | 2/2002 | |
| KR | 10-2001-0027172 | 4/2001 | |

* cited by examiner

*Primary Examiner* — Nadine Norton
*Assistant Examiner* — Stephanie Duclair
(74) *Attorney, Agent, or Firm* — Marshall, Gerstein & Borun LLP

(57) ABSTRACT

A method of forming a semiconductor device comprises forming a mask pattern over an etch target layer, forming an ion implantation region in the mask pattern through an ion implantation process, and forming an ion non-implantation region within the mask pattern, removing the ion implantation region on a top surface of the ion non-implantation region, removing the ion non-implantation region, and patterning the etch target layer by using spacers that comprise the ion implantation region as an etch mask.

19 Claims, 6 Drawing Sheets

METHOD OF FORMING SEMICONDUCTOR DEVICE

CROSS-REFERENCE TO RELATED APPLICATION

Priority to Korean patent application number 10-2009-0106462 filed on Nov. 5, 2009, the entire disclosure of which is incorporated by reference herein, is claimed.

BACKGROUND

Exemplary embodiments relate generally to a method of forming a semiconductor device and, more particularly, to a method of forming a semiconductor device that is capable of finely forming the patterns of the semiconductor device by overcoming an exposure resolution limit.

In a common semiconductor device formation process, a hard mask pattern is formed on a base layer (for example, a silicon layer, an insulating layer, or a conductive layer) including a predetermined etch target layer for forming a pattern. The base layer is etched by an etch process using the hard mask pattern as an etch mask pattern, to form the patterns of the semiconductor device.

The hard mask pattern is typically patterned using a photoresist pattern, formed by a photolithography process including exposure and development processes, as an etch mask pattern or can be patterned by using another hard mask pattern, patterned using the above photoresist pattern as an etch mask pattern, as an etch mask pattern. In this case, there are limits to the fineness of the hard mask pattern and the patterns of the semiconductor device because of the resolution limit of exposure equipment.

Accordingly, for highly-integrated semiconductor devices, the hard mask pattern for patterning the patterns of the semiconductor device must be finer than the resolution of exposure equipment.

BRIEF SUMMARY

Exemplary embodiments relate to a method of forming a semiconductor device that is capable of finely forming the patterns of the semiconductor device by overcoming the exposure resolution limit.

A method of forming a semiconductor device according to a first aspect of the disclosure comprises forming a mask pattern over an etch target layer, forming an ion implantation region in the mask pattern through an ion implantation process, and forming an ion non-implantation region within the mask pattern, removing the ion implantation region on a top surface of the ion non-implantation region, removing the ion non-implantation region, and patterning the etch target layer by using spacers, composed of the ion implantation region, as an etch mask. The mask pattern preferably is a photoresist pattern. During the ion implantation process, silicon (Si) ions are preferably implanted.

A method of forming a semiconductor device according to a second aspect of the disclosure comprises forming mask patterns over an etch target layer, forming an ion implantation region in each of the mask patterns through an ion implantation process, and forming an ion non-implantation region within each of the mask patterns, removing the ion implantation region on respective top surfaces of ion non-implantation regions, forming an auxiliary pattern between the mask patterns, removing remaining portions of the ion implantation regions, and patterning the etch target layer by using the auxiliary patterns and the ion non-implantation regions as an etch mask. The mask pattern preferably is a photoresist pattern. During the ion implantation process, silicon (Si) ions are preferably implanted.

A method of forming a semiconductor device according to a third aspect of the disclosure comprises forming a first mask layer on a base layer, forming second mask pattern over the first mask layer, forming an ion implantation region by implanting ions into a top portion and sidewalls of the second mask pattern, etching the ion implantation region to expose the second mask pattern into which the ions are not implanted to form spacers, exposing the first mask layer by removing the second mask pattern into which the ions are not implanted, and removing the exposed first mask layer by using the spacers as an etch mask to form first mask patterns.

The method preferably further comprises etching the base layer by using the first mask patterns as an etch mask.

The ions preferably include silicon.

The method preferably further comprises forming an anti-reflective coating layer over the first mask layer, before forming the second mask pattern. The method preferably further comprises forming the second mask pattern and simultaneously exposing the anti-reflective coating layer, when implanting the ions, forming the ion implantation region in the exposed anti-reflective coating layer, when etching the ion implantation region, removing the ion implantation region formed in the anti-reflective coating layer, and removing the second mask pattern into which the ions are not implanted and simultaneously removing the anti-reflective coating layer into which the ions are not implanted.

Removing the second mask pattern into which the ions are not implanted preferably is performed by using $O_2$ plasma.

The second mask pattern preferably is made of a photoresist material.

A method of forming a semiconductor device according to a fourth aspect of the disclosure comprises forming a first mask layer on a base layer, forming second mask patterns over the first mask layer, forming an ion implantation region by implanting ions into a top portion and sidewalls of the respective second mask patterns, etching the ion implantation regions to expose the respective second mask patterns into which the ions are not implanted to form spacers, forming an auxiliary pattern on the first mask layer exposed between the spacers, exposing the first mask layer by removing the spacers, and removing the exposed first mask layer by using the second mask patterns into which the ions are not implanted and the auxiliary pattern as an etch mask to form first mask patterns.

The method preferably further comprises etching the base layer by using the first mask patterns as an etch mask.

The ions preferably include silicon.

The method preferably further comprises forming an anti-reflective coating layer over the first mask layer, before forming the second mask patterns. The method preferably further comprises forming the second mask patterns and simultaneously exposing the anti-reflective coating layer, when implanting the ions, forming the ion implantation region in the exposed anti-reflective coating layer, and when etching the ion implantation region, removing the ion implantation region formed in the anti-reflective coating layer.

The auxiliary pattern preferably is made of identical materials as the second mask patterns into which the ions are not implanted.

The second mask patterns preferably are made of photoresist materials.

DESCRIPTION OF EMBODIMENTS

Figure 1A:
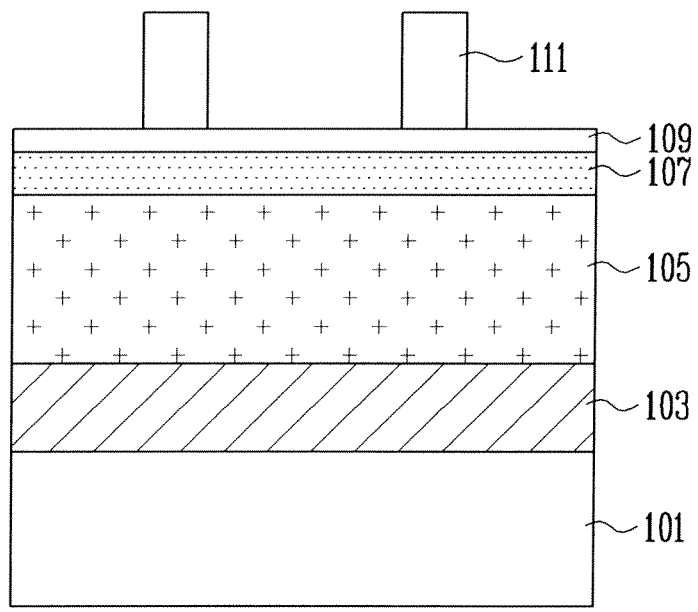
FIGS. 1A to 1E are cross-sectional views illustrating a method of forming a semiconductor device which is capable of forming fine patterns by overcoming the exposure resolution limit.

Hereinafter, exemplary embodiments of the disclosure are described in detail with reference to the accompanying drawings. The drawing figures are provided to allow those having ordinary skill in the art to understand the scope of the embodiments of the disclosure.

When an element, such as a layer, is referred to as being "on (or over)" another element (for example, a semiconductor substrate), it can directly come in contact with the other element, or a third element can be interposed between the two elements. Further, in the drawings, the size and thickness of each layer is enlarged for ease of description and clarity, and the disclosure is not limited thereto. In the drawings, like reference numerals designate like elements throughout the specification FIGS. 1A to 1E are cross-sectional views, illustrating a method of forming hard mask patterns finer than the exposure resolution limit and a method of forming the patterns of a semiconductor device using the same.

Referring to FIG. 1A, a hard mask layer 103, first and second auxiliary layers 105, 107, and an anti-reflective coating layer 109 are formed over a base layer 101 that defines an etch target layer.

The base layer 101 preferably is a semiconductor substrate, or an insulating layer or a conductive layer that comprises a semiconductor substrate to constitute a semiconductor device.

The hard mask layer 103 functions as an etch mask in a process of patterning the base layer 101. The hard mask layer 103 preferably comprises a material having a different etch characteristic from the material of the base layer 101.

The first and second auxiliary layers 105, 107 are patterned in a subsequent process to form steps on a surface of the entire structure. In particular, the first auxiliary layer 105 preferably comprises material having a different etch characteristic from material of spacers formed in a subsequent process. In this case, any one of the first auxiliary layer 105 and the spacers can be selectively etched when both are simultaneously exposed.

Where the hard mask layer 103 is made of polysilicon, the first auxiliary layer 105 preferably is made of amorphous carbon and the second auxiliary layer 107 preferably is made of SiON.

The anti-reflective coating layer 109 improves the profile of photoresist patterns 111 by preventing scattering of a light source in an exposure process of forming the photoresist patterns 111. The anti-reflective coating layer 109 preferably is made of an organic material.

Figure 1B:
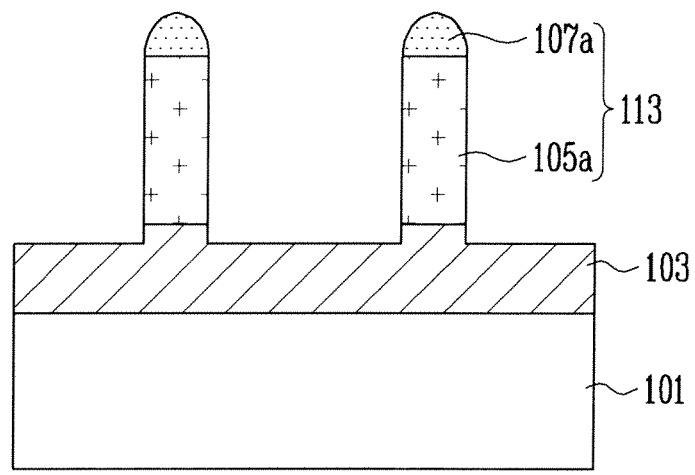

Referring to FIG. 1B, second spacer isolation patterns 107a are formed by etching the anti-reflective coating layer (109 of FIG. 1A) and the second auxiliary layer (107 of FIG. 1A) through an etch process using the photoresist patterns (111 of FIG. 1A) as an etch mask. First spacer isolation patterns 105a are formed by etching the first auxiliary layer (105 of FIG. 1A) through an etch process using the second spacer isolation patterns 107a as an etch mask. Consequently, spacer isolation patterns 113, each having a stack structure of the first and second spacer isolation patterns 105a, 107a, are formed over the hard mask layer 103. The hard mask layer 103 is exposed between the spacer isolation patterns 113.

After forming the spacer isolation patterns 113, a cleaning process is performed. Next, the remaining photoresist patterns and anti-reflective coating layer (111 and 109 of FIG. 1A) are removed.

Figure 1C:
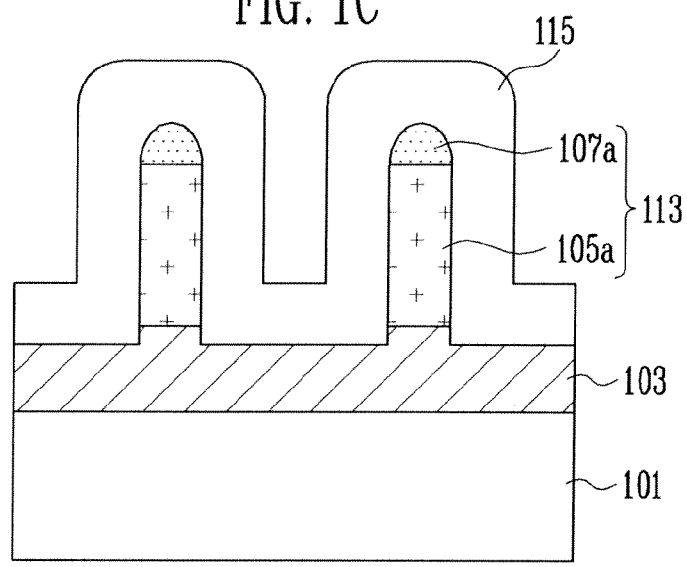

Referring to FIG. 1C, a spacer layer 115 is formed on top surfaces and sidewalls of the spacer isolation patterns 113 and on the exposed surface of the hard mask layer 103. The spacer layer 115 preferably is made of material having a different etch characteristic from materials of the first spacer isolation patterns 105a. For example, where the first spacer isolation patterns 105a are formed of an amorphous carbon layer, the spacer layer 115 preferably is formed of an Ultra Low Temperature Oxide (ULTO) layer. The ULTO layer used as the spacer layer 115 is preferably formed at low temperature to an extent that layers formed under the spacer layer 115 are not damaged. The ULTO layer preferably is formed in a temperature range of 50° C. to 100° C.

The spacer layers 115 formed on the sidewalls of the spacer isolation patterns 113 neighboring each other preferably have their respective thicknesses set so that they are spaced apart one another at intervals equal to ¼ of the pitch between the spacer isolation patterns 113. Furthermore, the thickness of each of the spacer layers 115 formed on the sidewalls of the spacer isolation patterns 113 preferably is set to ¼ of the pitch between the spacer isolation patterns 113. Furthermore, the thickness of the spacer layer 115 preferably is identical to the width of the spacer isolation pattern 113.

The spacer layers 115 are stacked to face each other with the spacer isolation pattern 113 interposed therebetween. Thus, the spacer layers 115 are patterned into spacers that are separated from each other with the spacer isolation pattern 113 interposed therebetween by performing an etch process of exposing the spacer isolation patterns 113 in a subsequent process.

Figure 1D:
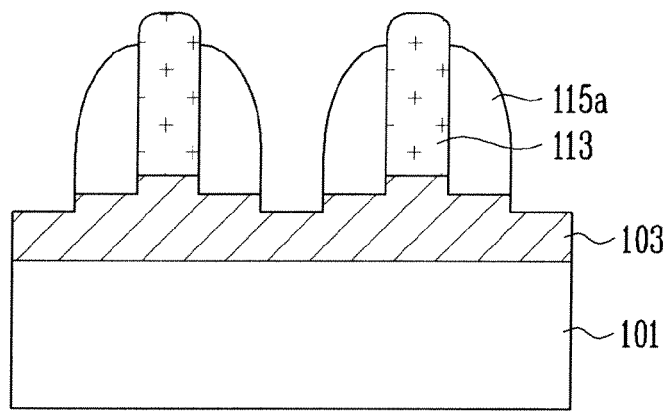

Referring to FIG. 1D, the spacer layers formed on the hard mask layer 103 and the top surface of the spacer isolation patterns 113 are removed, but the spacer layers remain on the sidewalls of the spacer isolation patterns 113, thus forming spacers 115a.

The spacers 115a are preferably etched by a blanket etch process. Through the formation of the spacers 115a, the hard mask layer 103 is exposed between the spacers 115a.

Figure 1E:
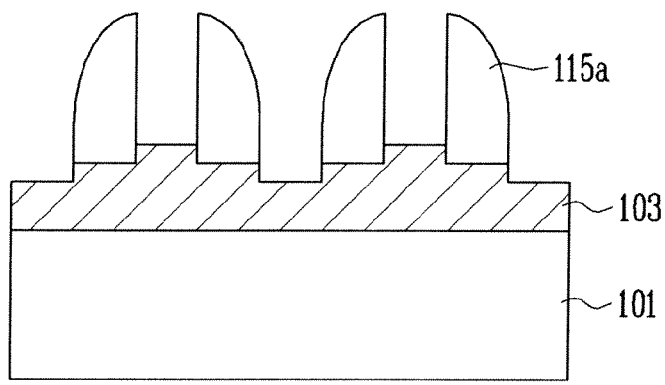

Referring to FIG. 1E, the hard mask layer 103 under the spacer isolation patterns (113 of FIG. 1D) is exposed by removing the spacer isolation patterns. Consequently, the hard mask layer 103 is exposed between the spacers 115a.

The spacers 115a were formed on the sidewalls of the spacer isolation patterns formed using a photoresist pattern. The interval between the spacers 115a and the width of the spacer 115a can be determined by controlling the thickness of the spacer layer. Accordingly, if the hard mask layer 103 is patterned by using the spacers 115a as an etch barrier, the hard mask layer 103 can be patterned to have a width finer than the exposure resolution limit.

However, where the hard mask layer 103 is patterned by using the method described above with reference to FIGS. 1A to 1E, first and second auxiliary layers and spacers must be further formed, and a process of cleaning spacer isolation patterns must be added. Hereinafter, the disclosure provides a method of forming hard mask patterns and the patterns of a semiconductor device, which are finer than the exposure resolution limit, by using a simpler method than the above method.

FIGS. 2A to 2F are cross-sectional views, illustrating a method of forming hard mask patterns according to a first embodiment of this disclosure and a method of forming the patterns of a semiconductor device using the same.

Figure 2A:
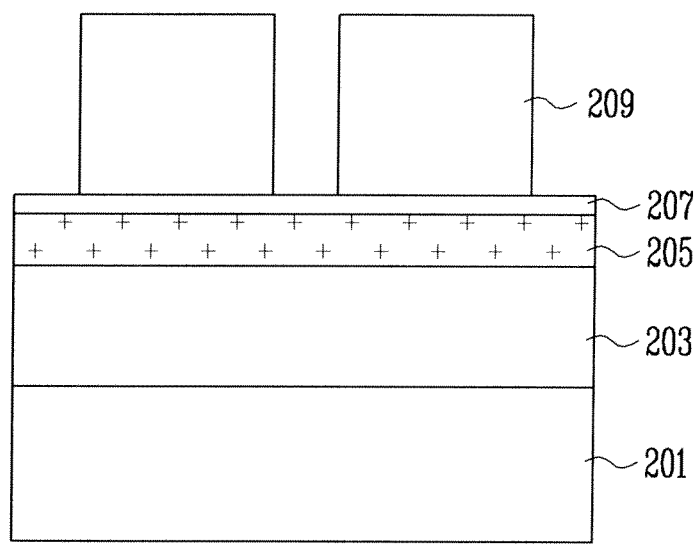
FIGS. 2A to 2F are cross-sectional views illustrating a method of forming a semiconductor device according to a first embodiment of the disclosure.

Referring to FIG. 2A, first mask layers 203, 205 and an anti-reflective coating layer 207 are formed over a base layer 201. A second mask layer (not shown) is formed over the anti-reflective coating layer 207. Second mask patterns 209 are formed by patterning the second mask layer.

The base layer 201 preferably is a semiconductor substrate, or is an insulating layer or a conductive layer that is formed on a semiconductor substrate to constitute a semiconductor device.

The first mask layers 203, 205 are hard mask layers formed to pattern the base layer 201 and preferably are made of a material having a different etch characteristic from the material of the base layer 201. In some embodiments, the first mask layers 203, 205 can be formed of a single layer or a multi-layer having a stack of different materials according to materials of the base layer 201. For example, where the base layer 201 is a polysilicon layer for gate patterns, the first mask layers 203, 205 preferably have a stack structure of an oxide layer 203 and the polysilicon layer 205.

The second mask pattern 209 preferably is a photoresist pattern for patterning the first mask layers 203, 205.

The anti-reflective coating layer 207 improves the profile of a photoresist pattern by preventing scattering of a light source in an exposure process for forming the second mask patterns 209 (thus, the photoresist pattern). The anti-reflective coating layer 207 preferably is made of organic material. The anti-reflective coating layer 207 is exposed between the second mask patterns 209 after the second mask patterns 209 are formed.

Figure 2B:
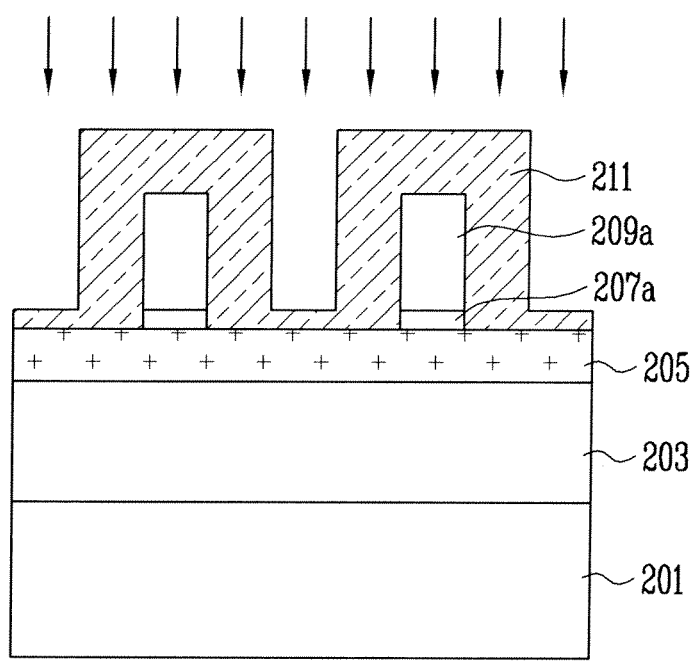

Referring to FIG. 2B, an ion implantation region 211 is formed by implanting ions into a top portion and sidewalls of the second mask pattern (209 of FIG. 2A). The ion implantation region 211 comprises material that is different from the material of the second mask pattern 209a into which the ions are not implanted. Accordingly, in a subsequent process, one of the ion implantation region 211 and the second mask pattern 209a into which the ions are not implanted can be selectively removed. Silicon (Si) preferably is used as the implanted ions. When the ions are implanted, an ion implantation angle and an ion implantation energy can be controlled so that the ions are implanted into only the top portion and sidewalls of the second mask pattern. Accordingly, the ions cannot be implanted into a part of the second mask pattern.

Where the anti-reflective coating layer (207 of FIG. 2A) is formed, the ions are also implanted into the anti-reflective coating layer (207 of FIG. 2A) exposed between the second mask patterns (209 of FIG. 2A), thereby forming the ion implantation region 211. Accordingly, the surfaces of the anti-reflective coating layers 207a into which the ions are not implanted and the second mask patterns 209a into which the ions are not implanted are covered with the ion implantation region 211.

The silicon (Si) or other ions can be implanted by using gas including silicon (or another species of ion). Energy and a dose when the ions are implanted can be variously set according to an ion implantation depth and etch selectivity. For example, the ion implantation region 211 can be formed by implanting silicon with energy of 10 KeV or higher and a dose of $5E14\ cm^{-2}$ to $2E15\ cm^{-2}$.

The ion implantation regions 211 formed on the sidewalls of the second mask patterns 209a into which the ions are not implanted preferably their thicknesses set so that they are spaced apart one another at intervals each of that is ¼ of the pitch between the second mask patterns 209a into which the ions are not implanted. Furthermore, the thickness of each of the ion implantation regions 211 formed on the sidewalls of the second mask patterns 209a into which the ions are not implanted preferably is set to ¼ of the pitch between the second mask patterns 209a into which the ions are not implanted. Furthermore, the thickness of the ion implantation region 211 preferably is identical to the width of the second mask pattern 209a into which the ions are not implanted.

Figure 2C:
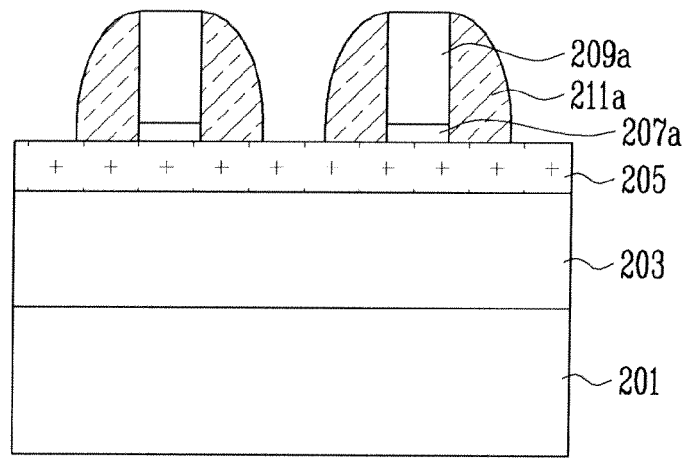

Referring to FIG. 2C, the ion implantation regions 211 are etched to expose the second etch mask patterns 209a into which the ions are not implanted and the first mask layer 205. Here, an etch process is performed so that the ion implantation regions remain as spacers 211a on the sidewalls of the second mask patterns 209a into which the ions are not implanted. In the etch process of removing the ion implantation regions, the ion implantation region formed in the anti-reflective coating layer is removed to expose the first mask layer 205.

To form the spacers 211a as described above, a blanket etch process using gas including CF, such as $CF_4$ or $CHF_3$, preferably is performed.

Figure 2D:
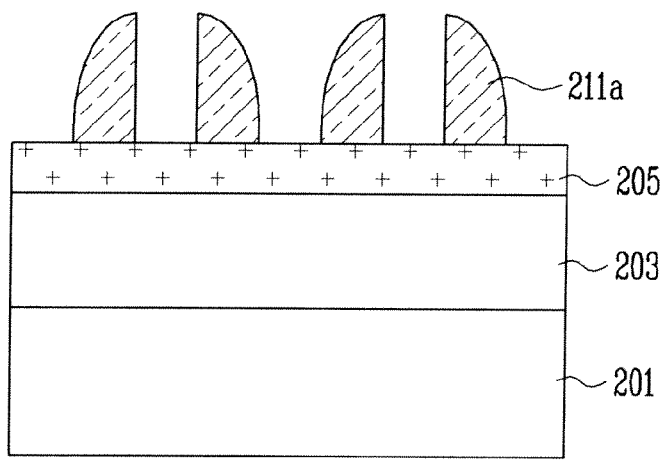

Referring to FIG. 2D, the second mask patterns (209a of FIG. 2C) and the anti-reflective coating layers (207a of FIG. 2C) into which the ions are not implanted are removed. Consequently, the first mask layer 205 is exposed between the spacers 211a. Here, the anti-reflective coating layers 207a into which the ions are not implanted preferably are made of organic material, like the second mask patterns 209a into which the ions are not implanted. Accordingly, the anti-reflective coating layer 207a and the second mask patterns 209a into which the ions are not implanted preferably are removed by a strip process using $O_2$ plasma.

The spacers 211a are formed by implanting the ions as described above, and so they have different materials from the anti-reflective coating layer 207a and the second mask patterns 209a into which the ions are not implanted. Accordingly, the spacers 211a remain intact although the strip process using the $O_2$ plasma is performed.

Figure 2E:
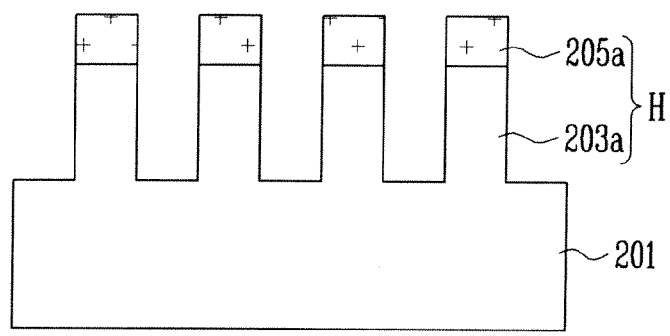

The interval between the spacers 211a and the width of the spacer 211a can be determined by controlling the thickness of the ion implantation region. Accordingly, if the first mask layers 205, 203 are patterned by using the spacers 211a as an etch barrier, hard mask patterns H, each including first mask patterns 203a, 205a and having a width finer than the exposure resolution limit, can be formed as shown in FIG. 2E.

As described above, in the disclosure, the spacers 211a can be formed even though an additional spacer layer is not deposited. Accordingly, a spacer layer formation process can be omitted.

Furthermore, in the disclosure, the spacers 211a are formed by forming the ion implantation regions by implanting ions into the top portion and sidewalls of the second mask pattern, and then etching the ion implantation regions. Accordingly, as described above with reference to FIGS. 1A to 1E, additional spacer isolation patterns need not to be patterned in order to form spacers. Accordingly, processes of forming first and second auxiliary layers, accompanied in order to form the spacer isolation patterns, can be omitted, and a process of cleaning the spacer isolation patterns can also be omitted. Furthermore, a process of depositing an additional spacer layer can be omitted.

After forming the hard mask patterns H, the remaining spacers (211a of FIG. 2D) can be removed.

Figure 2F:
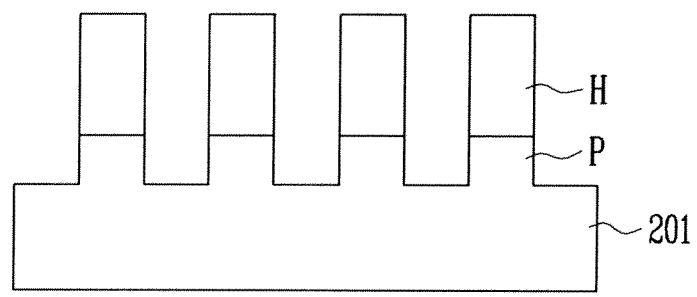

Referring to FIG. 2F, patterns P of a semiconductor device can be formed by etching the base layer 201 using the hard mask patterns H as an etch barrier.

In the first embodiment of this disclosure, the hard mask pattern H is formed to have a width finer than the exposure resolution limit. Accordingly, the pattern P of the semiconductor device can also be formed to have a width finer than the exposure resolution limit.

FIGS. 3A to 3D are cross-sectional views, illustrating a method of forming hard mask patterns according to a second embodiment of this disclosure and a method of forming the patterns of a semiconductor device using the same.

Figure 3A:
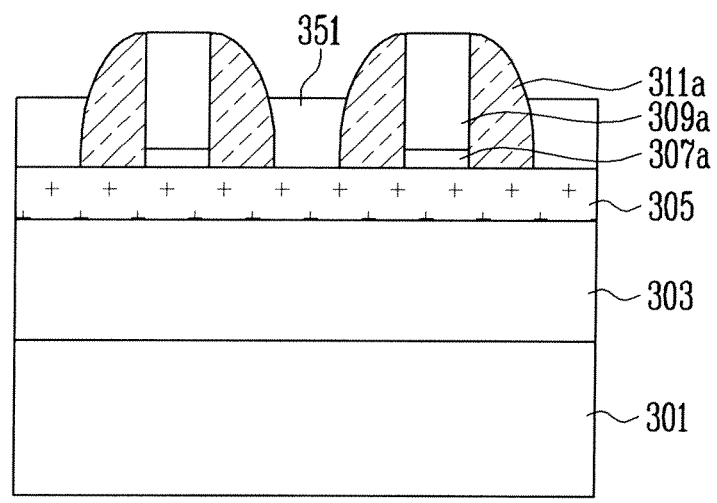
FIGS. 3A to 3D are cross-sectional views illustrating a method of forming a semiconductor device according to the second embodiment of the disclosure.

Referring to FIG. 3A, first mask layers 303, 305 are formed over a base layer 301, and an anti-reflective coating layer is formed over the first mask layers 303, 305, using the same method as described above with reference to FIGS. 2A to 2C. After forming second mask patterns over the anti-reflective coating layer, an ion implantation region (not shown) is formed by implanting ions into the top portion and sidewalls of the second mask pattern. The ion implantation region is etched to form spacers 311a on the sidewalls of second mask patterns 309a and anti-reflective coating layers 307a into which the ions are not implanted. The first mask layer 305 is exposed between the spacers 311a. The materials and functions of the base layer 301, the first mask layers 303, 305, the anti-reflective coating layer, and the second mask layer are the same as those described with reference to analogous elements of FIG. 2A, and descriptions of them are omitted.

Next, in the second embodiment of this disclosure, auxiliary patterns 351 are formed on the first mask layer 305 exposed between the spacers 311a. The auxiliary patterns 351 can be formed in such a manner that an auxiliary layer is formed on the first mask layer 305, including the spacers 311a, so that space between the spacers 311a is buried and the auxiliary layer is then etched by a blanket etch process so that the second mask patterns 309a into which the ions are not implanted are exposed.

The auxiliary patterns 351 preferably are made of photoresist material like the second mask patterns 309a into which the ions are not implanted.

In the second embodiment of this disclosure, even though an additional spacer layer is not deposited as in the first embodiment, the spacers 311a can be formed. Accordingly, a process of forming a spacer layer can be omitted.

Furthermore, in the present embodiment, as in the first embodiment, the spacers 311a are formed such that the ion implantation region is formed by implanting the ions into the top portion and sidewalls of the second mask pattern, and the ion implantation region is then etched. Thus, as described above with reference to FIGS. 1A to 1E, additional spacer isolation patterns, providing steps in order to form spacers, need not to be patterned. Accordingly, in the second embodiment of this disclosure, a process of forming first and second auxiliary layers, accompanied in order to form the spacer isolation patterns, can be omitted, and a process of cleaning the spacer isolation patterns can be omitted.

Figure 3B:
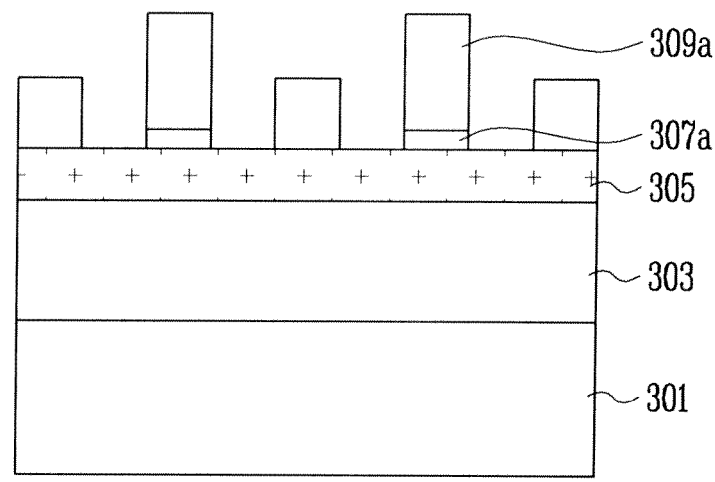

Referring to FIG. 3B, the spacers (311a of FIG. 3A) are removed. Thus, the first mask layer 305 can be exposed between the auxiliary patterns 351 and the second mask patterns 309a (see FIG. 3A) into which the ions are not implanted.

The interval between the auxiliary pattern 351 and the second mask pattern 309a (FIG. 3A) into which the ions are not implanted are determined by the width of the spacer. The spacer is formed by implanting silicon (Si) or other ions into the sidewalls of the second mask pattern, and the width of the spacer can be determined by control the thickness of the ion implantation region. Accordingly, since the width of the spacer can be finer than the exposure resolution limit, the interval between the auxiliary pattern 351 and the second mask pattern 309a into which the ions are not implanted can also be finer than the exposure resolution limit.

Figure 3C:
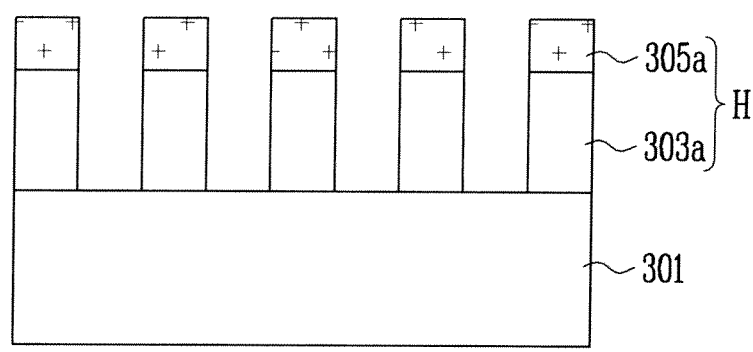

Referring to FIG. 3C, the first mask layers (303, 305 of FIG. 3B) are etched using the auxiliary patterns (351 of FIG. 3A) and the second mask patterns (309a of FIG. 3B) into which the ions are not implanted as an etch mask. Accordingly, hard mask patterns H, each including the first mask patterns 303a, 305a, can be spaced apart one another at intervals, each finer than the exposure resolution limit.

After forming the hard mask patterns H, the remaining auxiliary patterns (351 of FIG. 3A) and the remaining second mask patterns (309a of FIG. 3B) into which the ions are not implanted can be removed.

Figure 3D:
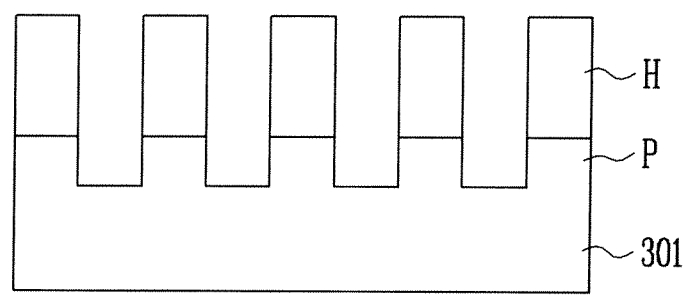

Referring to FIG. 3D, the patterns P of the semiconductor device can be formed by etching the base layer 301 by using the hard mask patterns H as an etch barrier.

In the second embodiment of this disclosure, the hard mask patterns H are spaced apart one another at intervals, each finer than the exposure resolution limit. Accordingly, the patterns P of the semiconductor device can also be spaced apart one another at intervals, each finer than the exposure resolution limit.

As described above, in accordance with the disclosure, the ion implantation region is formed by implanting ions into the top portion and sidewalls of a mask pattern, and an ion implantation region is then etched to form spacers. Accordingly, a process of depositing an additional spacer layer, a process of forming spacer isolation patterns, a process of cleaning the spacer isolation patterns, and a process of forming first and second auxiliary layers can be omitted. Furthermore, a process of forming hard mask patterns and the patterns of a semiconductor device, each finer than the exposure resolution limit, can be simplified.

In accordance with this disclosure, after forming the ion implantation region by implanting ions into the top portion and sidewalls of the mask pattern, the ion implantation region is etched so that the ion implantation region remains as the spacers on the sidewalls of the mask patterns. Accordingly, one of the spacer (i.e., the ion implantation regions) and the mask pattern into which the ions are not implanted can be selectively removed. Since the width of the spacer is determined by the thickness of the ion implantation region, the exposure resolution limit can be overcome and so the width of the spacer can be finely formed.

In accordance with this disclosure, hard mask patterns are formed by using the spacers which overcome the exposure resolution limit and have a fine width, and the patterns of a semiconductor device are formed by using the hard mask patterns. Accordingly, the patterns of the semiconductor device can also overcome the exposure resolution limit.

What is claimed is:

1. A method of forming a semiconductor device, comprising:

forming a mask pattern over an etch target layer;

implanting ions into the mask pattern to form an ion implantation region in a surface area of the mask pattern, thereby forming an ion non-implantation region surrounded by the ion implantation region;

performing an etching process to expose the ion non-implantation region, thereby leaving portions of the ion implantation region on sidewalls of the ion non-implantation region;

removing the ion non-implantation region; and patterning the etch target layer by using the portions of the ion implantation region as an etch mask.

2. The method of claim 1, wherein the mask pattern is a photoresist pattern.

3. The method of claim 1, comprising implanting silicon (Si) ions during the implanting of the ions.

4. The method of claim 1, comprising in the implanting of the ions, implanting the ions into a top portion and sidewalls of the mask pattern by controlling an ion implantation angle and an ion implantation energy.

5. A method of forming a semiconductor device, comprising:

forming mask patterns over an etch target layer;

implanting ions into the respective mask patterns to form an ion implantation region in a surface area of each of the mask patterns, thereby forming an ion non-implantation region surrounded by the ion implantation region;

performing an etching process to expose the ion non-implantation region, thereby leaving portions of the ion implantation region on sidewalls of the ion non-implantation region;

forming an auxiliary pattern between the mask patterns;

removing the portions of the ion implantation regions; and patterning the etch target layer by using the auxiliary patterns and the ion non-implantation region as an etch mask.

6. The method of claim 5, wherein the mask pattern is a photoresist pattern.

7. The method of claim 5, comprising implanting silicon (Si) ions during the implanting of the ions.

8. A method of forming a semiconductor device, comprising:

forming a first mask layer on a base layer;

forming a second mask pattern over the first mask layer;

implanting ions into the second mask pattern to form an ion implantation region in a surface area of the second mask pattern, thereby forming an ion non-implantation region surrounded by the ion implantation region;

performing an etching process to expose the ion non-implantation region, thereby leaving portions of the ion implantation region on sidewalls of the ion non-implantation region;

exposing the first mask layer by removing the ion non-implantation region of the second mask pattern; and removing the exposed first mask layer by using the portions of the ion implantation as an etch mask, thereby forming first mask patterns.

9. The method of claim 8, further comprising etching the base layer by using the first mask patterns.

10. The method of claim 8, wherein the ions include silicon.

11. The method of claim 8, further comprising forming an anti-reflective coating layer over the first mask layer, before forming the second mask pattern, wherein the method further comprises:

forming the second mask pattern and simultaneously exposing the anti-reflective coating layer;

when implanting the ions, forming an ion implantation region in the exposed anti-reflective coating layer;

when etching the ion implantation region of the second mask pattern, removing the ion implantation region of the anti-reflective coating layer; and when removing the ion non-implantation region of the second mask pattern, removing an ion non-implantation region of the anti-reflective coating layer.

12. The method of claim 8, comprising removing the second mask pattern into which the ions are not implanted by using $O_2$ plasma.

13. The method of claim 8, wherein the second mask pattern comprises photoresist material.

14. A method of forming a semiconductor device, comprising:

forming a first mask layer on a base layer;

forming second mask patterns over the first mask layer;

implanting ions into the respective second mask patterns to form an ion implantation region in a surface area of each of the second mask patterns, thereby forming an ion non-implantation region surrounded by the ion implantation region;

performing an etching process to expose the ion non-implantation region, thereby leaving portions of the ion implantation region on sidewalls of the ion non-implantation region;

forming an auxiliary pattern on the first mask layer exposed between the mask patterns;

exposing the first mask layer by removing the portions of the ion implantation region; and removing the exposed first mask layer by using the ion non-implantation region and the auxiliary patterns as an etch mask, thereby forming a first mask patterns.

15. The method of claim 14, further comprising etching the base layer by using the first mask patterns.

16. The method of claim 14, wherein the ions include silicon.

17. The method of claim 14, further comprising forming an anti-reflective coating layer over the first mask layer, before forming the second mask patterns, wherein the method further comprises:

forming the second mask patterns and simultaneously exposing the anti-reflective coating layer;

when implanting the ions, forming an ion implantation region in the exposed anti-reflective coating layer; and when etching the ion implantation region of the respective second mask patterns, removing the ion implantation region of the anti-reflective coating layer.

18. The method of claim 14, wherein the auxiliary pattern and the second mask patterns into which the ions are not implanted are formed of identical material.

19. The method of claim 14, wherein the second mask patterns comprise photoresist material.

* * * * *